(12) United States Patent
Tei

(10) Patent No.: US 11,450,640 B2
(45) Date of Patent: Sep. 20, 2022

(54) WIRE BONDING APPARATUS AND MANUFACTURING METHOD FOR SEMICONDUCTOR APPARATUS

(71) Applicant: SHINKAWA LTD., Tokyo (JP)

(72) Inventor: Shinsuke Tei, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 552 days.

(21) Appl. No.: 16/622,291

(22) PCT Filed: Mar. 14, 2018

(86) PCT No.: PCT/JP2018/009832
§ 371 (c)(1),
(2) Date: Mar. 2, 2020

(87) PCT Pub. No.: WO2018/168888
PCT Pub. Date: Sep. 20, 2018

(65) Prior Publication Data
US 2020/0203307 A1    Jun. 25, 2020

(30) Foreign Application Priority Data
Mar. 16, 2017  (JP) .............................. JP2017-051836

(51) Int. Cl.
*H01L 23/00*    (2006.01)
(52) U.S. Cl.
CPC .............. *H01L 24/78* (2013.01); *H01L 24/43* (2013.01); *H01L 24/742* (2013.01); *H01L 24/85* (2013.01);
(Continued)

(58) Field of Classification Search
CPC ...................... H01L 2224/78631; H01L 24/78
See application file for complete search history.

(56) References Cited

U.S. PATENT DOCUMENTS 8,191,759 B2    6/2012  Tei et al.
2016/0365331 A1*  12/2016  Takagi ................ B23K 20/004

FOREIGN PATENT DOCUMENTS

JP         H04184947        7/1992
JP         H11168119        6/1999
(Continued)

OTHER PUBLICATIONS

"International Search Report (Form PCT/ISA/210)" of PCT/JP2018/009832, dated Jun. 12, 2018, with English translation thereof, pp. 1-2.
(Continued)

*Primary Examiner* — Yu-Hsi D Sun
(74) *Attorney, Agent, or Firm* — JCIPRNET

(57) ABSTRACT

A wire bonding apparatus includes: a first tensioner which forms, nearer a wire supply side than a bonding tool, a first gas flow for applying a tension toward the wire supply side on a wire; a second tensioner which forms, between the first tensioner and a pressing part of the bonding tool, a second gas flow for applying a tension toward the wire supply side on the wire; and a control part which controls the first tensioner and the second tensioner. The control part implements control, in a predetermined period after a first bonding step for bonding the wire to a first bonding point, to turn off at least the second gas flow of the second tensioner among the first tensioner and the second tensioner or to make at least the second gas flow smaller than in the first bonding step.

10 Claims, 10 Drawing Sheets

(52) U.S. Cl.
CPC ............... *H01L 2224/48227* (2013.01); *H01L 2224/78347* (2013.01); *H01L 2224/78353* (2013.01); *H01L 2224/78621* (2013.01); *H01L 2224/78631* (2013.01); *H01L 2224/78822* (2013.01); *H01L 2224/78901* (2013.01); *H01L 2225/1052* (2013.01)

(56) References Cited

FOREIGN PATENT DOCUMENTS

| JP | 4467631 | 5/2010 |
|----|---------|--------|
| JP | 2013084848 | 5/2013 |

OTHER PUBLICATIONS

"International Preliminary Report on Patentability (Form PCT/IPEA/409) of PCT/JP2018/009832", dated Mar. 14, 2019, with English translation thereof, pp. 1-12.

\* cited by examiner

WIRE BONDING APPARATUS AND MANUFACTURING METHOD FOR SEMICONDUCTOR APPARATUS

CROSS-REFERENCE TO RELATED APPLICATION

This application is a 371 application of the international PCT application serial no. PCT/JP2018/009832, filed on Mar. 14, 2018, which claims the priority benefit of Japan application no. 2017-051836, filed on Mar. 16, 2017. The entirety of each of the abovementioned patent applications is hereby incorporated by reference herein and made a part of this specification.

BACKGROUND OF THE INVENTION

Technical Field

The present invention relates to a wire bonding apparatus and a manufacturing method for semiconductor apparatus.

Related Art

A wire bonding apparatus that electrically connects a first bonding point (for example, a pad of a semiconductor die) and a second bonding point (for example, a lead of a package) with a wire is known. In this wire bonding apparatus, it is general to apply a tension toward the wire supply side on the wire in a series of wire bonding operations for forming a wire loop that connects the first bonding point and the second bonding point.

In this case, for example, if the wire tension is too large during the formation of the wire loop, the wire may be excessively stretched and the loop shape may be broken. Alternatively, if the wire tension is too large during bonding to the second bonding point, the wire may be cut off during the bonding, and wire falling in which the wire falls out of the bonding tool may occur. In view of these adverse effects, patent literature 1 proposes an invention in which a second clamper is arranged above an existing clamper in order to prevent the wire falling and the like, but maintenance is required for arranging the second clamp, and size reduction may be hindered.

LITERATURE OF RELATED ART

Patent Literature

Patent literature 1: Japanese Patent No. 4467631

SUMMARY

Problems to be Solved

The present invention has been made in view of the above circumstances, and aims to provide a wire bonding apparatus and a manufacturing method for semiconductor apparatus capable of performing good wire bonding while satisfying the demand for maintainability and size reduction.

Means to Solve Problems

A wire bonding apparatus of an aspect of the present invention, which manufactures a semiconductor apparatus having a wire loop in which a first bonding point and a second bonding point are connected by a wire, includes: a bonding arm movable on a plane parallel to a bonding surface and in a direction perpendicular to the bonding surface; an ultrasonic horn attached to a front end of the bonding arm; a bonding tool attached to one end of the ultrasonic horn, and having a pressing part for pressing a wire made to pass through the inside of the bonding tool to the first bonding point and the second bonding point to be bonded; a first tensioner which forms, nearer the wire supply side than the bonding tool, a first gas flow for applying a tension toward the wire supply side on the wire; a second tensioner which forms, between the first tensioner and the pressing part of the bonding tool, a second gas flow for applying a tension toward the wire supply side on the wire; and a control part which controls the first tensioner and the second tensioner; the control part implements control, in a predetermined period after a first bonding step for bonding the wire to the first bonding point, to turn off at least the second gas flow of the second tensioner among the first and second tensioners or to make at least the second gas flow smaller than in the first bonding step.

According to the configuration, the control is implemented, in any predetermined period after the first bonding step, to turn off at least the second gas flow of the second tensioner or to make at least the second gas flow smaller than in the first bonding step, and thus a suitable loop can be formed without reducing a bonding processing speed. In addition, a separate clamper for making the wire tension suitable is not required. Accordingly, it is possible to provide a wire bonding apparatus capable of performing good wire bonding while satisfying the demand for maintainability and size reduction.

Effect

According to the present invention, good wire bonding can be performed while satisfying the demand for maintainability and size reduction.

Figure 1:
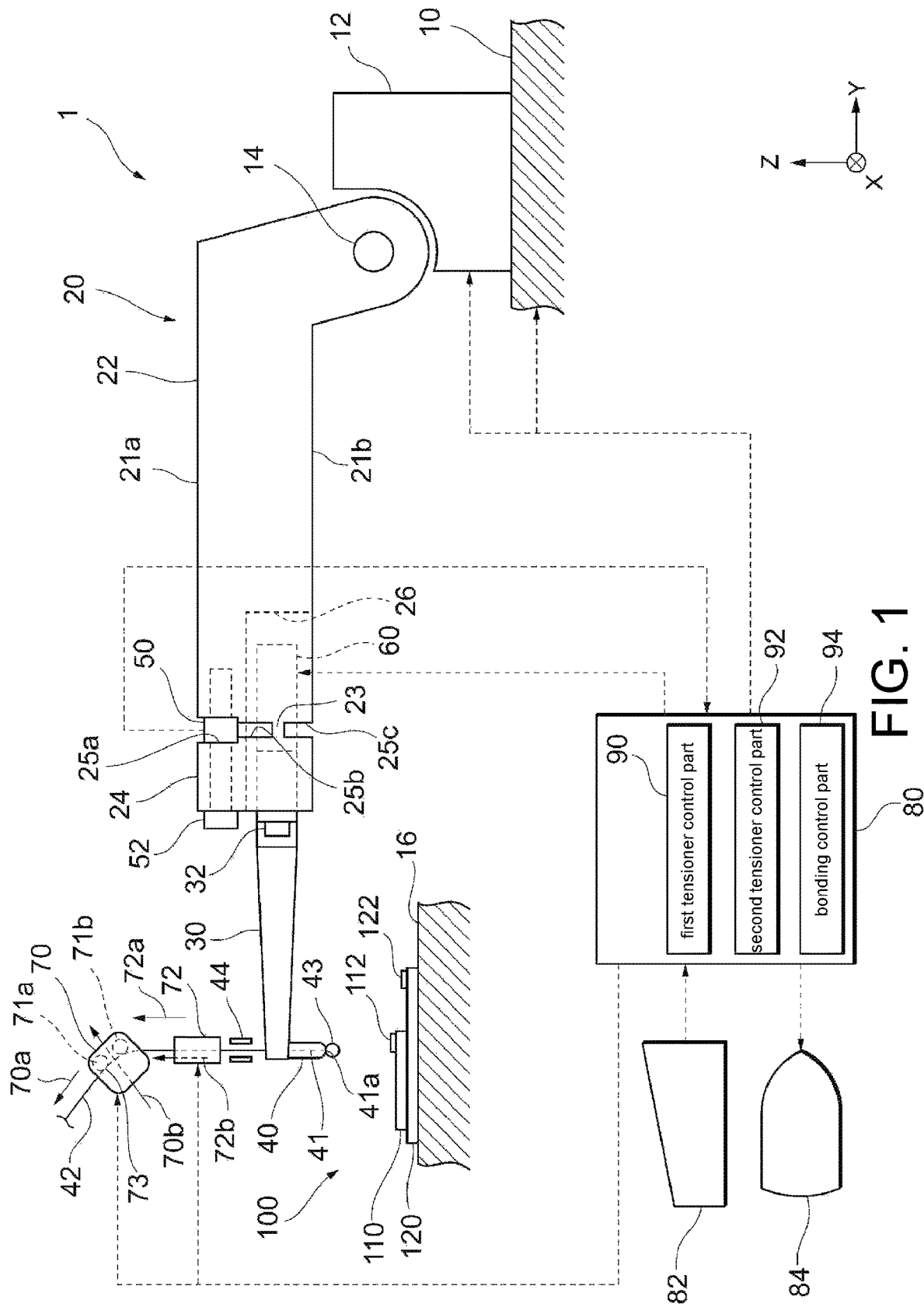
FIG. 1 is a diagram showing an overall outline of a wire bonding apparatus of a first embodiment.
Figure 2:
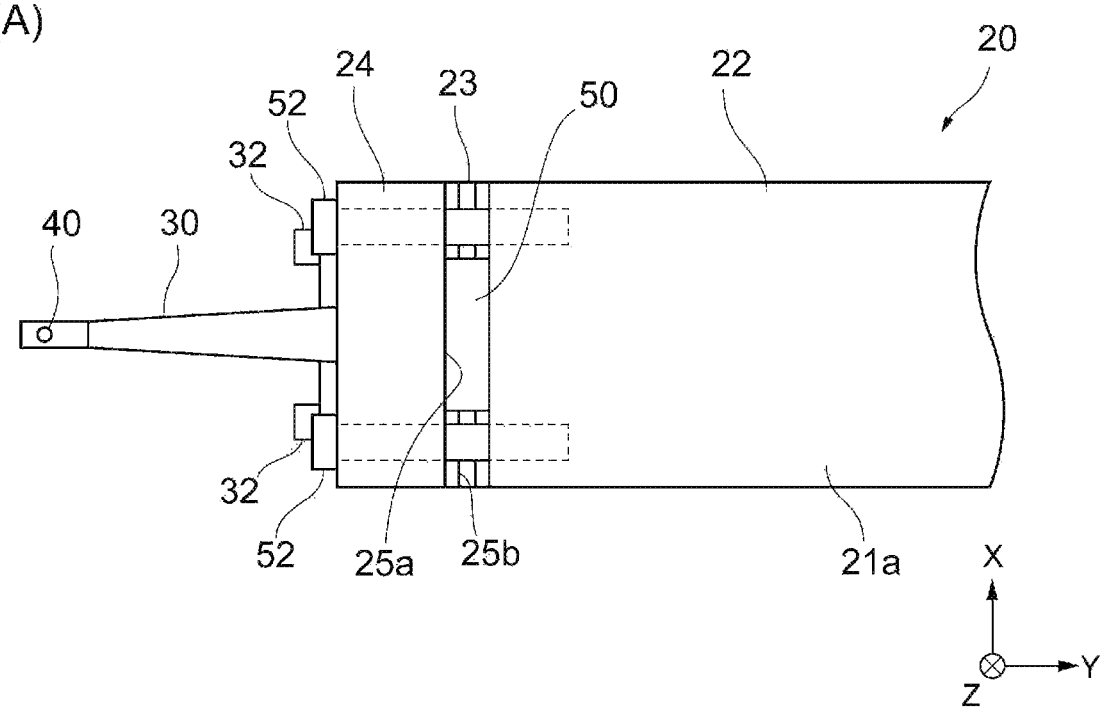
Figure 2:
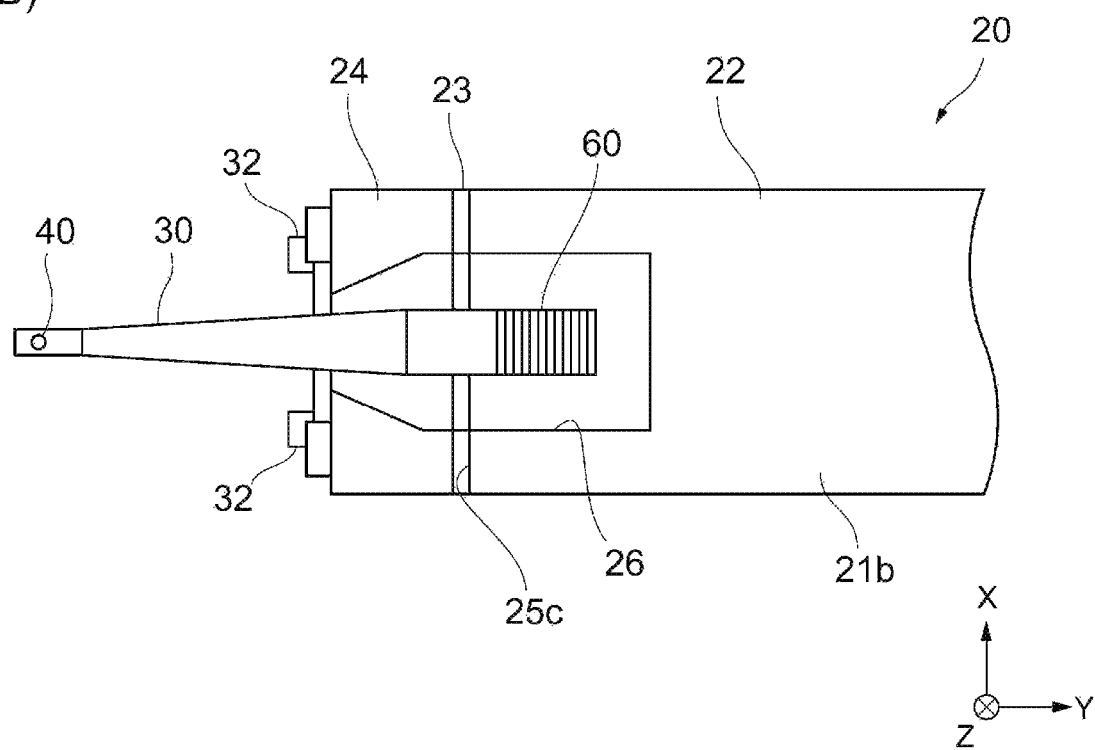

(A) of FIG. 2 is a top view of a bonding arm in FIG. 1, and (B) of FIG. 2 is a bottom view of the bonding arm in FIG. 1.

Figure 3:
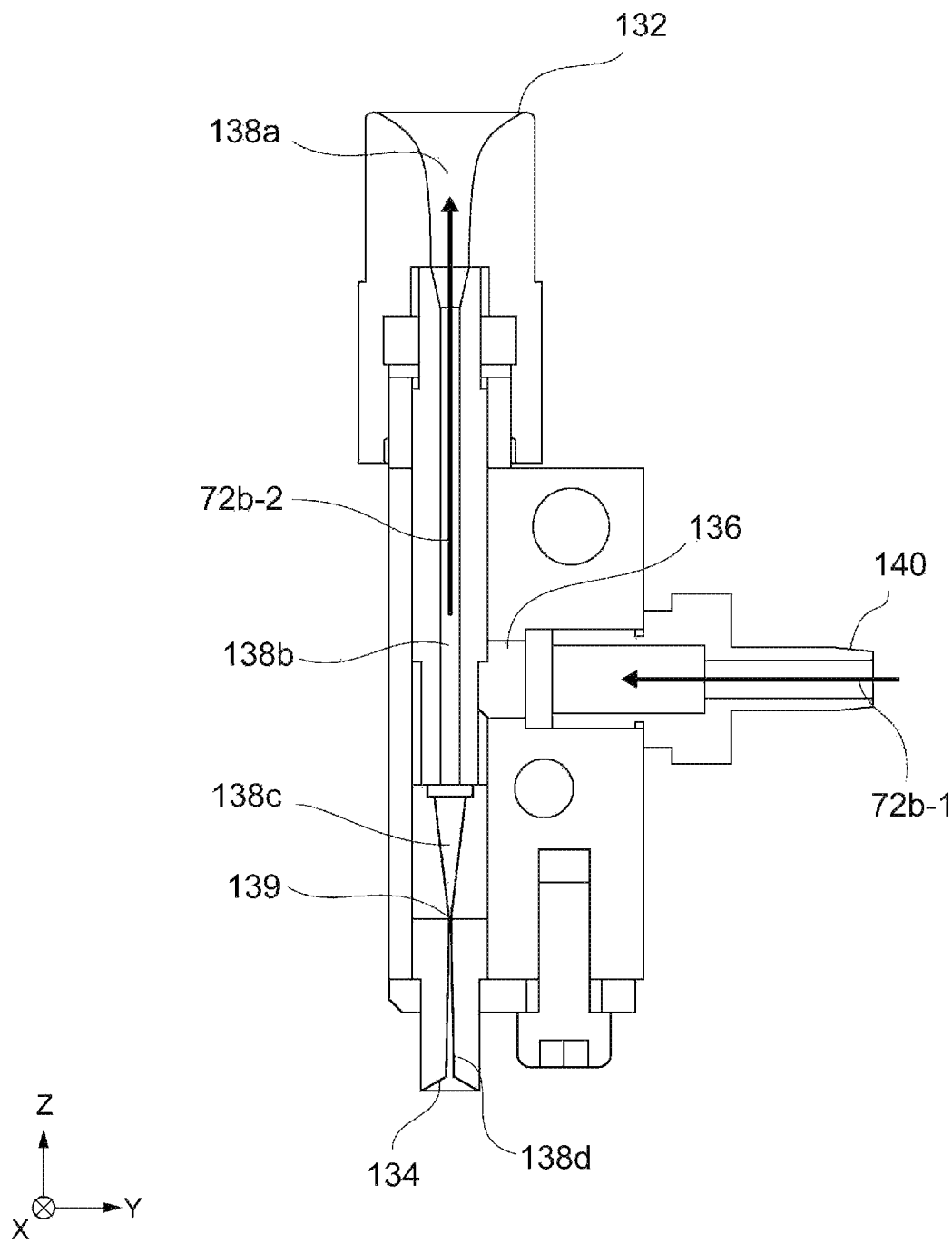

FIG. 3 is a diagram showing details of a second tensioner in FIG. 1.

Figure 4:
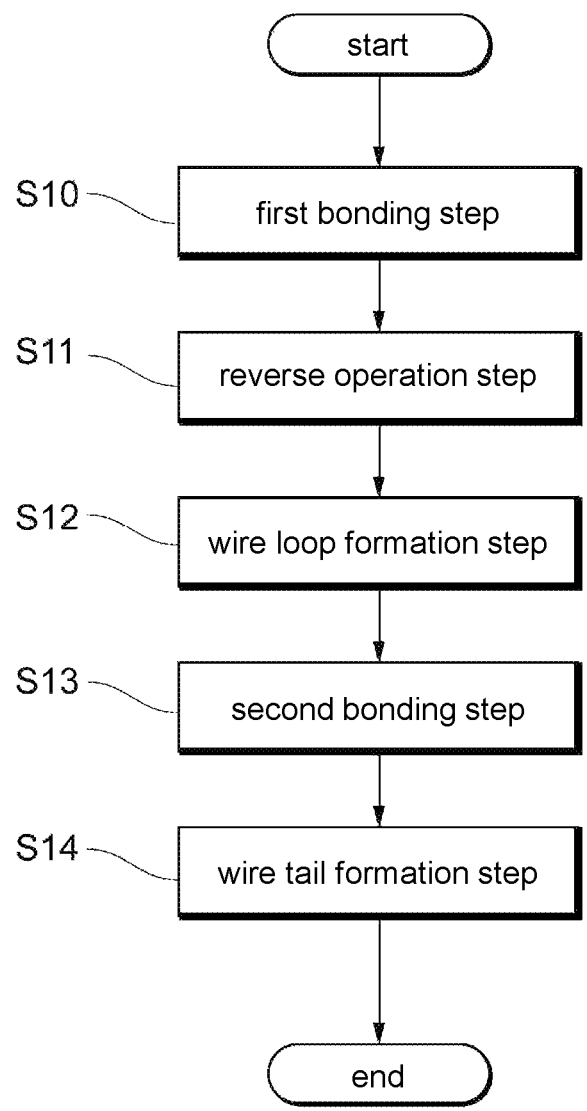

FIG. 4 is a diagram showing a flowchart of a manufacturing method for semiconductor apparatus of the first embodiment.

Figure 5:
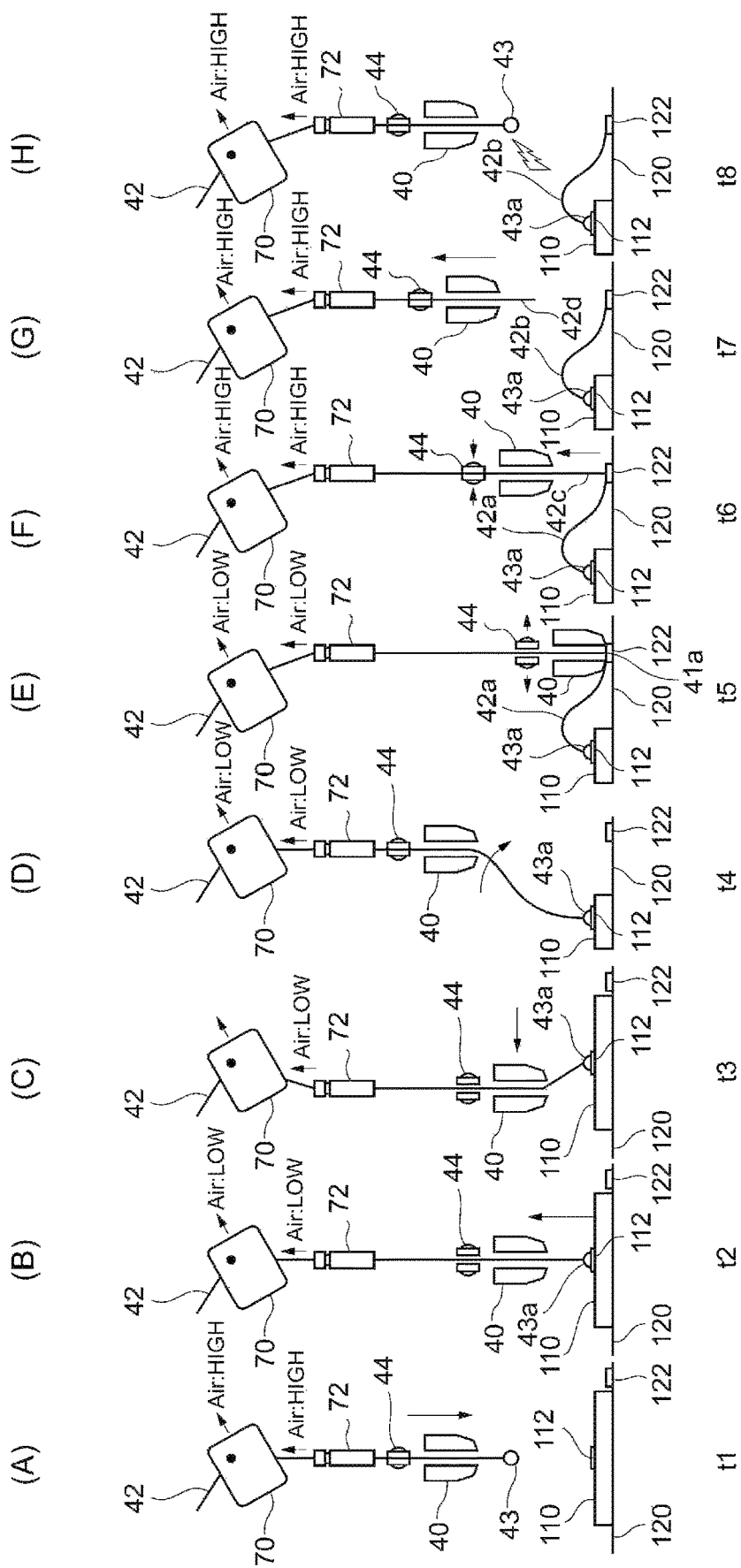

(A)-(H) of FIG. 5 are diagrams showing the operation of the manufacturing method for semiconductor apparatus of the first embodiment.

Figure 6:
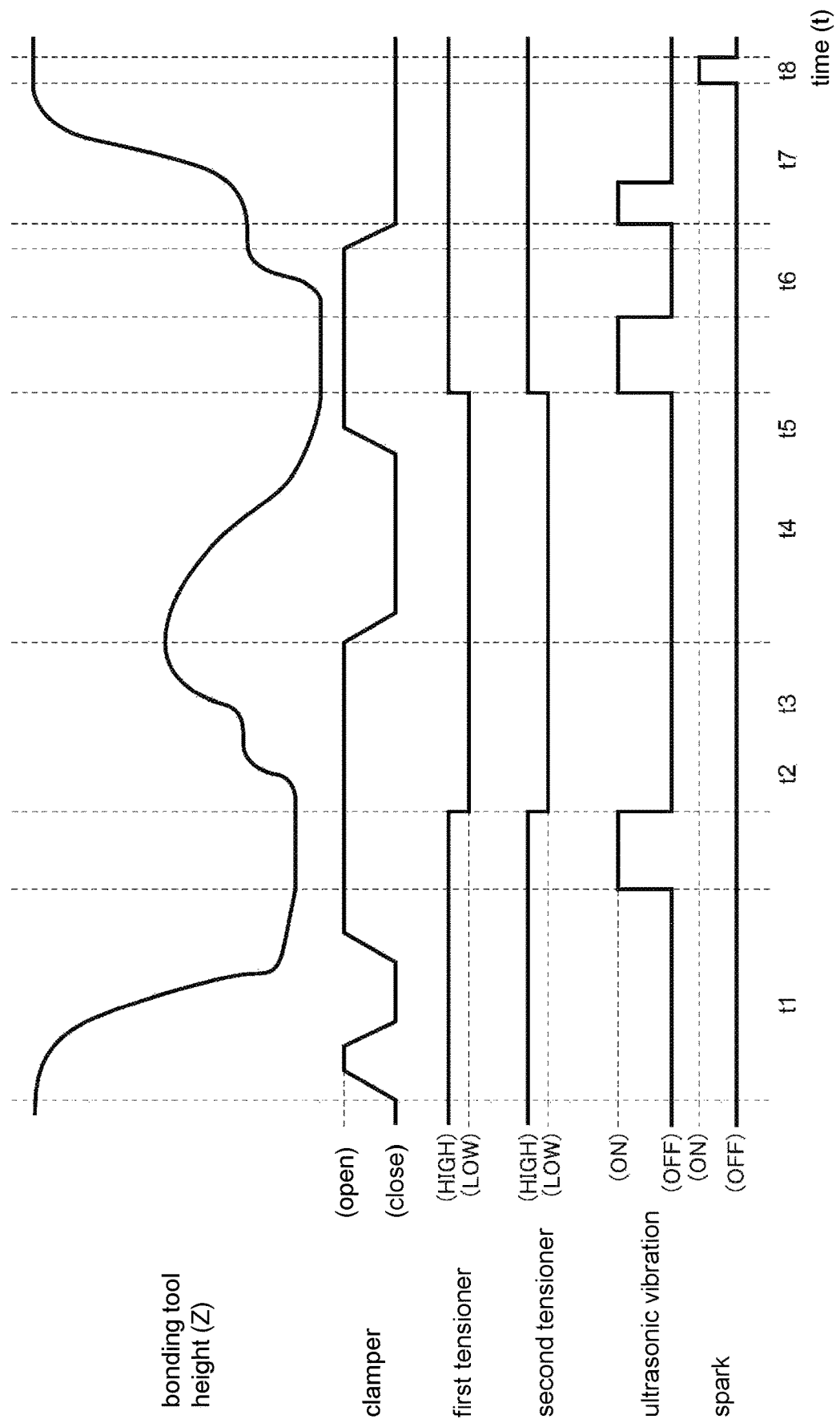

FIG. 6 is a diagram showing a timing chart of (A)-(H) of FIG. 5.

Figure 7:
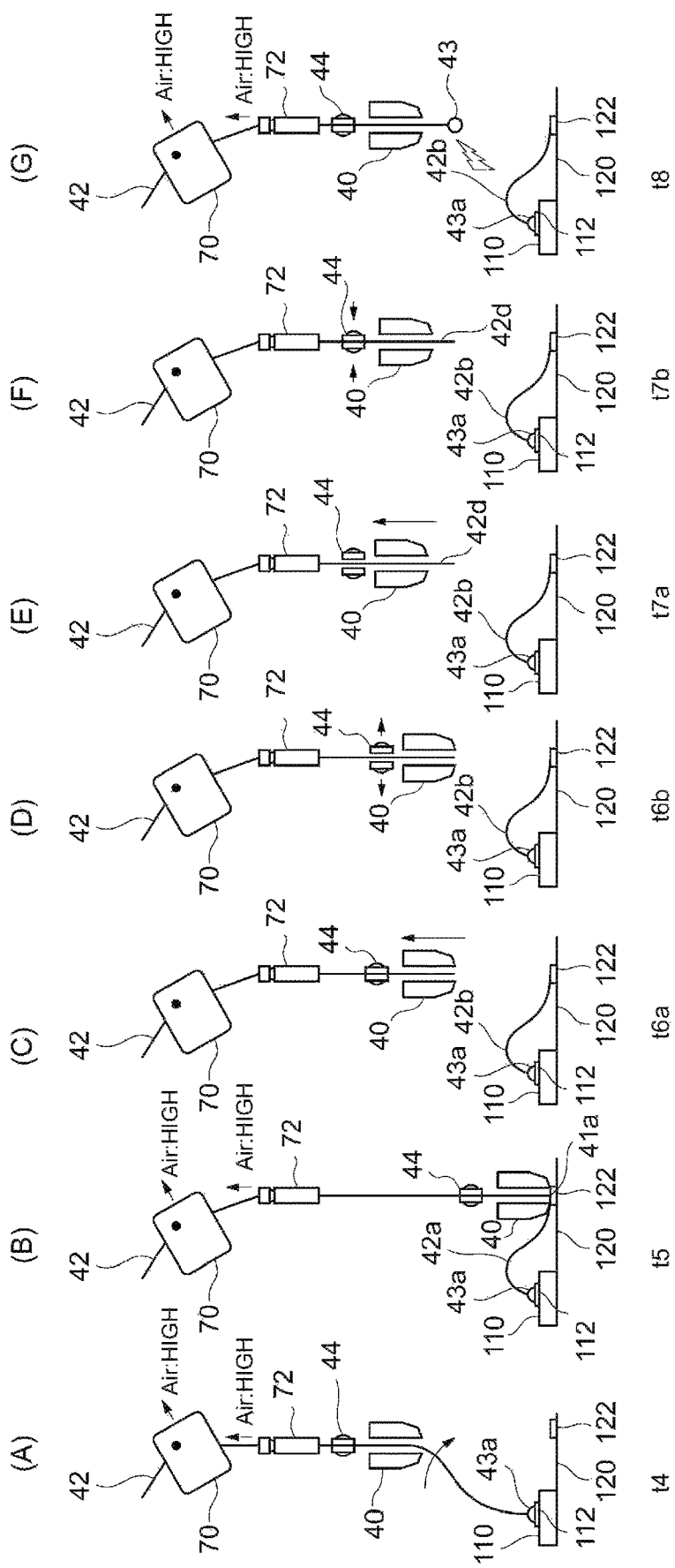

(A)-(G) of FIG. 7 are diagrams showing the operation of the manufacturing method for semiconductor apparatus of a second embodiment.

Figure 8:
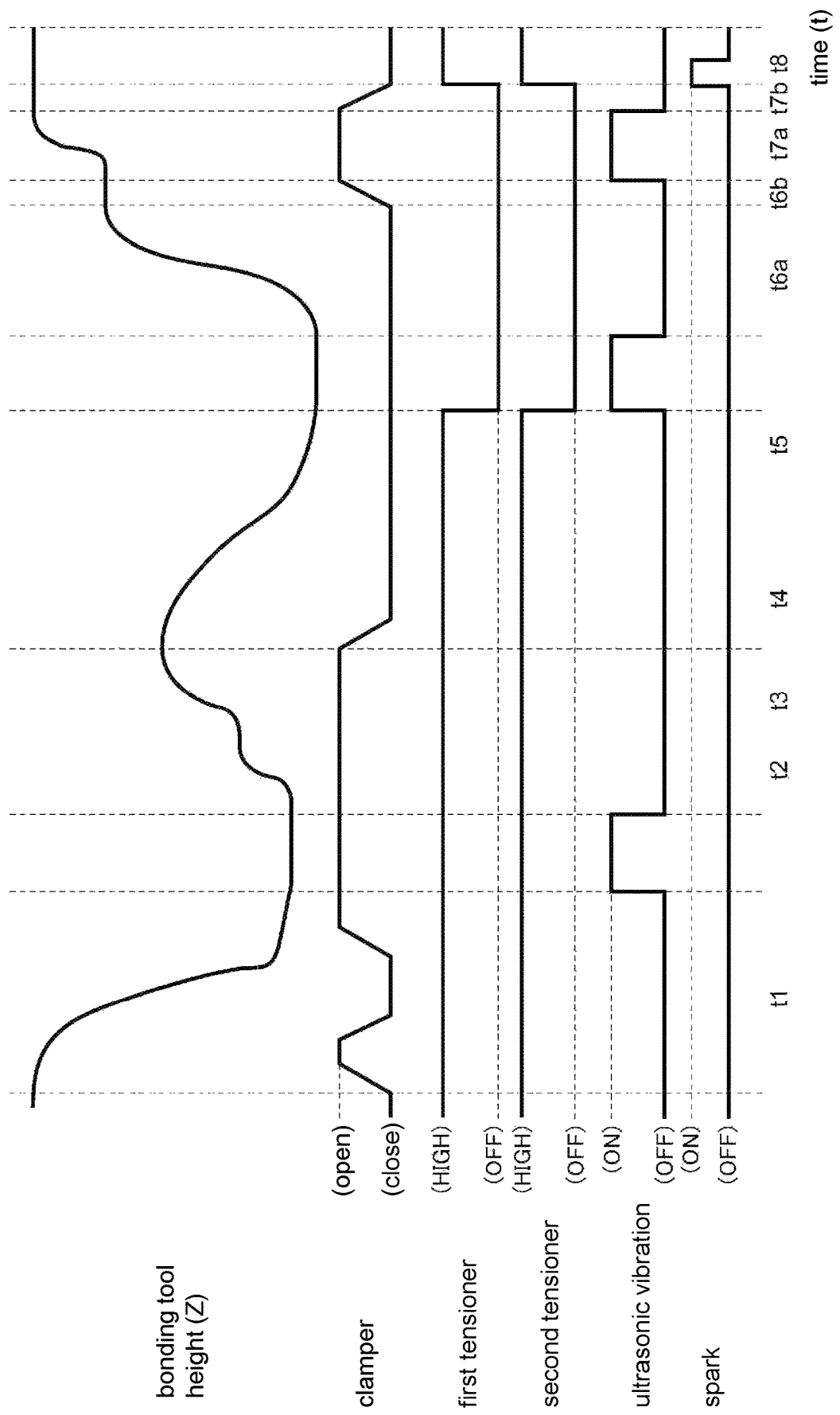

FIG. 8 is a diagram showing a timing chart of (A)-(G) of FIG. 7.

Figure 9:
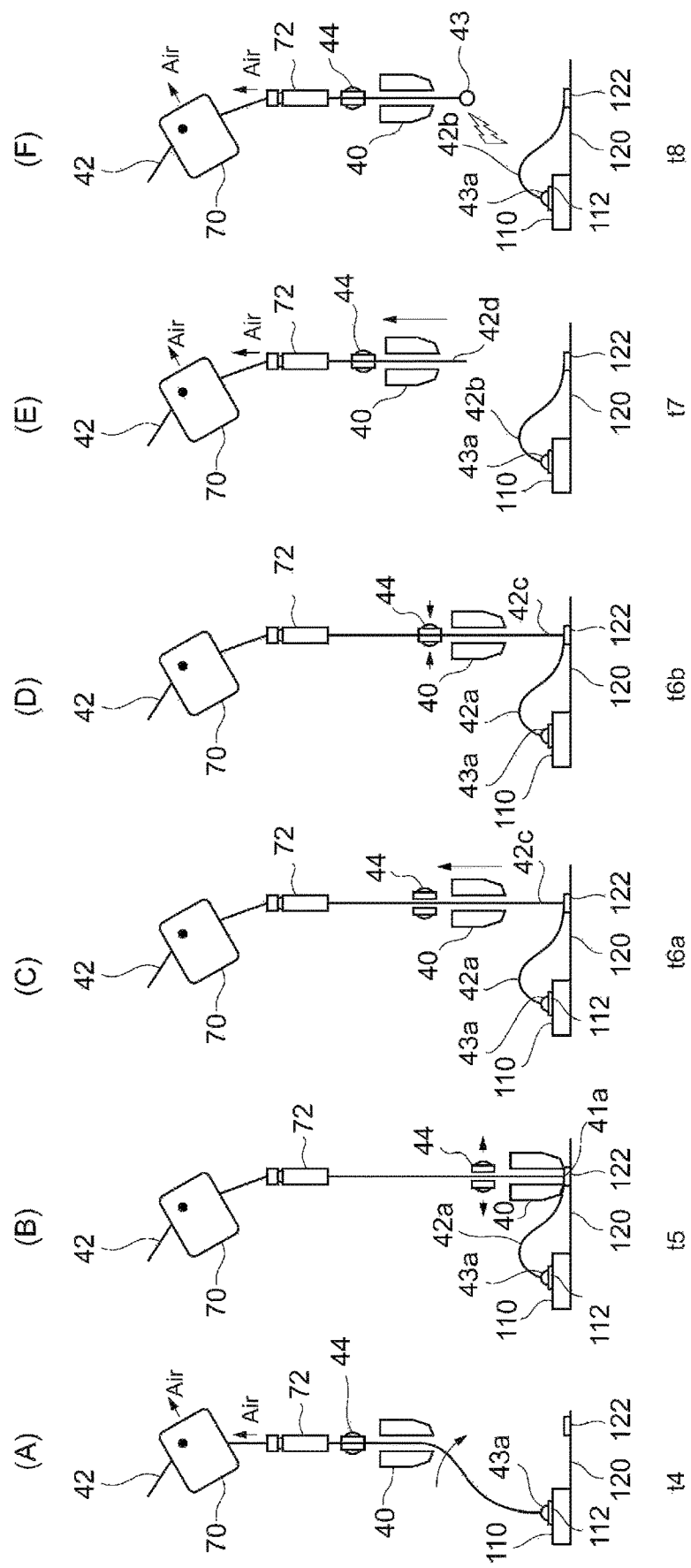

(A)-(F) of FIG. 9 are diagrams showing the operation of a manufacturing method for semiconductor apparatus of a third embodiment.

Figure 10:
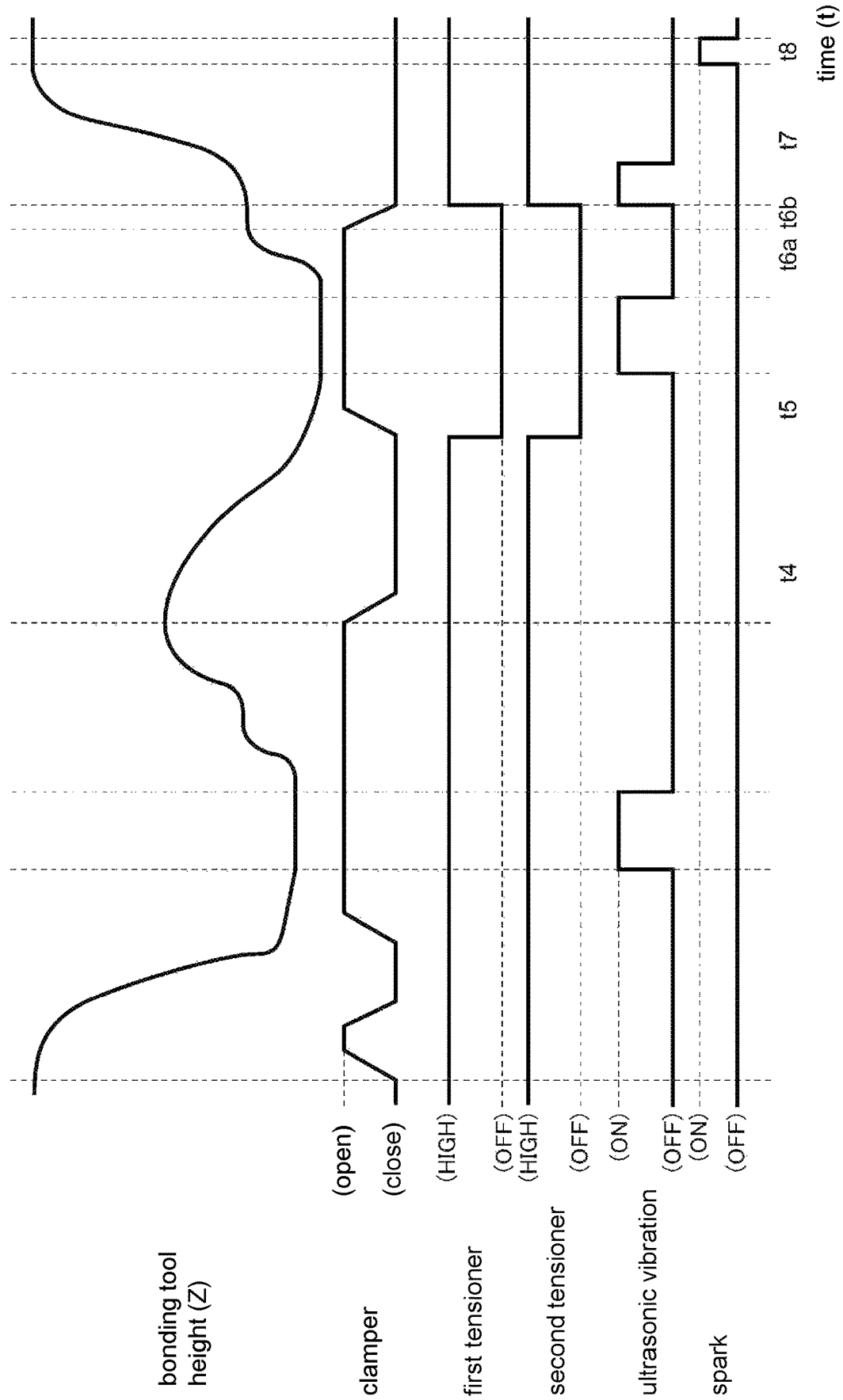

FIG. 10 is a diagram showing a timing chart of (A)-(F) of FIG. 9.

DESCRIPTION OF THE EMBODIMENTS

Embodiments of the present invention are described below. In the following description of the drawings, the same or similar components are denoted by the same or similar reference signs. The drawings are illustrative, the dimensions and shapes of the respective parts are schematic, and the technical scope of the present invention should not be limited to the embodiments.

FIRST EMBODIMENT

FIG. 1 is a diagram showing an overall outline of a wire bonding apparatus of the embodiment. In addition, (A) and (B) of FIG. 2 are partially enlarged views of a bonding arm in the wire bonding apparatus. Specifically, (A) of FIG. 2 shows a top view of the bonding arm, and (B) of FIG. 2 shows a bottom view of the bonding arm. FIG. 3 is a diagram showing details of a second tensioner.

As shown in FIG. 1, a wire bonding apparatus 1 includes an XY drive mechanism 10, a Z drive mechanism 12, a bonding arm 20, an ultrasonic horn 30, a bonding tool 40, a load sensor 50, an ultrasonic vibrator 60, a first tensioner 70, a second tensioner 72, and a control part 80.

The XY drive mechanism 10 is configured to be slidable in an XY-axis direction (direction parallel to the bonding surface), and the Z drive mechanism (linear motor) 12 capable of swinging the bonding arm 20 in a Z-axis direction (direction perpendicular to the bonding surface) is arranged in the XY drive mechanism (linear motor) 10.

The bonding arm 20 is supported by a support shaft 14 and is configured to be swingable with respect to the XY drive mechanism 10. The bonding arm 20 is formed in a substantially rectangular parallelepiped so as to extend from the XY drive mechanism 10 to a bonding stage 16 on which a work-piece 100 to be bonded is placed.

The work-piece 100 is a semiconductor apparatus including at least one semiconductor die. The work-piece 100 has a first bonding point and a second bonding point to be bonded, and by connecting these bonding points with a wire, a semiconductor apparatus having a wire loop in which the first bonding point and the second bonding point are connected by the wire can be manufactured.

As shown in FIG. 1, for example, the work-piece 100 includes a semiconductor die 110 having a plurality of electrode pads 112 serving as the first bonding point, and a substrate 120 having a plurality of electrode pads 122 serving as the second bonding point. Here, the first bonding point refers to a site to be bonded first between two points connected by a wire, and the second bonding point refers to a site to be bonded later between the two points. Besides, the configuration of the semiconductor apparatus is not limited to FIG. 1, and the combination of the first bonding point and the second bonding point may be two electrode pads of the semiconductor die, or may be an electrode pad of the semiconductor die and a lead terminal of a lead frame. In addition, the order of the first bonding point and the second bonding point is not limited, and the electrode pads of the substrate may be bonded first, and then the electrode pads of the semiconductor die may be bonded.

The support shaft 14 is, for example, substantially at the same height as the work surface (bonding surface) of a work-piece 18. The bonding arm 20 includes an arm base end 22 attached to the XY drive mechanism 10, an arm front end 24 which is located on the front end side of the arm base end 22 and to which the ultrasonic horn 30 is attached, and a connection part 23 which connects the arm base end 22 and the arm front end 24 and has flexibility. The connection part 23 includes slits 25a and 25b having a predetermined width which extend from a top surface 21a of the bonding arm 20 toward a bottom surface 21b of the bonding arm 20, and a slit 25c having a predetermined width which extends from the bottom surface 21b of the bonding arm 20 toward the top surface 21a of the bonding arm 20. In this way, the connection part 23 is locally formed as a thin part by the respective slits 25a, 25b, and 25c, and thus the arm front end 24 is configured to be bent to the arm base end 22.

As shown in FIG. 1 and (B) of FIG. 2, a concave portion 26 for accommodating the ultrasonic horn 30 is formed on the bottom surface 21b side of the bonding arm 20. The ultrasonic horn 30 is attached to the arm front end 24 by a horn fixing screw 32 while being accommodated in the concave portion 26 of the bonding arm 20. The ultrasonic horn 30 holds the bonding tool 40 at the front end protruding from the concave portion 26, and the ultrasonic vibrator 60 which generates ultrasonic vibration is arranged in the concave portion 26. The ultrasonic vibration can be generated by the ultrasonic vibrator 60, transmitted to the bonding tool 40 by the ultrasonic horn 30, and applied to a bonding target via the bonding tool 40. The ultrasonic vibrator 60 is, for example, a piezo vibrator.

In addition, as shown in FIG. 1 and (A) of FIG. 2, the slits 25a and 25b are sequentially formed from the top surface 21a toward the bottom surface 21b on the top surface 21a side of the bonding arm 20. The slit 25a on the upper side is formed wider than the slit 25b on the lower side. Then, the load sensor 50 is arranged in the upper slit 25a formed widely. The load sensor 50 is fixed to the arm front end 24 by a preload screw 52. The load sensor 50 is disposed so as to be sandwiched between the arm base end 22 and the arm front end 24. That is, the load sensor 50 is offset from a longitudinal center axis of the ultrasonic horn 30 in a contact/separation direction with respect to the bonding target, and is attached between a rotation center of the bonding arm 20 and an attachment surface of the ultrasonic horn 30 at the arm front end 24 (that is, the front end surface on the bonding tool 40 side at the arm front end 24). Then, as described above, since the ultrasonic horn 30 which holds the bonding tool 40 is attached to the arm front end 24, when a load is applied to the front end of the bonding tool 40 due to a reaction force from the bonding target, the arm front end 24 is bent to the arm base end 22, and the load can be detected in the load sensor 50. The load sensor 50 is, for example, a piezo element load sensor.

The bonding tool 40 bonds a wire 42 to the work-piece 100. The bonding tool 40 is a capillary equipped with a through hole 41 through which the wire 42 passes. In this case, the wire 42 used for bonding is made to pass through the through hole 41 of the bonding tool 40, and a part of the wire 42 can be fed out of the front end of the bonding tool 40. In addition, at the front end of the bonding tool 40, a pressing part 41a for pressing the wire 42 is arranged. The pressing part 41a has a rotationally symmetric shape around the axial direction of the through hole 41 of the bonding tool 40, and has a pressing surface on the lower surface around the through hole 41.

The bonding tool 40 is attached by spring power or the like to one end of the ultrasonic horn 30 so as to be replaceable. In addition, a clamper 44 is arranged above the bonding tool 40, and the clamper 44 is configured to restrain or release the wire 42 at a predetermined timing. Furthermore, a first tensioner 70 and a second tensioner 72 are arranged above the clamper 44. The first tensioner 70 and the second tensioner 72 are configured to respectively pass through the wire 42 and apply a tension toward the wire supply side (upper side in FIG. 1) on the wire 42 during bonding. That is, the first tensioner 70 and the second tensioner 72 respectively apply a tension on the wire 42 in the directions of arrows 70a and 72a. Furthermore, above the first tensioner 70 and the second tensioner 72, a spool (not shown) for winding the wire 42 is arranged, and the wire 42 is fed out of the spool.

The material of the wire 42 is appropriately selected based on easy processing and low electrical resistance, and uses, for example, gold (Au), copper (Cu), silver (Ag), or the like. Besides, in the wire 42, a free air ball 43 extending from the front end of the bonding tool 40 is bonded to the first bonding point of the work-piece 100.

Here, the first tensioner 70 and the second tensioner 72 are described in detail.

The first tensioner 70 is configured to form, nearer the wire supply side than the bonding tool 40, a first gas flow 70b for applying a tension toward the wire supply side (tension in the direction of the arrow 70a) on the wire 42. In addition, the second tensioner 72 is configured to form, between the first tensioner 70 and the pressing part 41a of the bonding tool 40, a second gas 72b for applying a tension toward the wire supply side (tension in the direction of the arrow 72a) on the wire 42. As described above, the second tensioner 72 is disposed downstream of the first tensioner 70 in the wire supply.

In the example shown in FIG. 1, the second tensioner 72 is disposed between the clamper 44 disposed above the bonding tool 40 and the first tensioner 70. Since the second tensioner 72 is arranged closer to the bonding tool 40 than the first tensioner 70, the influence of the wire tension is greater than that on the first tensioner 70.

Besides, for example, the first tensioner 70 has a fixed XYZ coordinate position, whereas the second tensioner 72 has a fixed Z coordinate position, and the XY coordinate can be moved together with the bonding tool 40.

The first tensioner 70 has stoppers 71a, 71b which guide the wire 42, and a sensor 73 which detects the position of the wire 42. The sensor 73 outputs a signal for stopping the feeding operation of the wire 42 performed by the spool when the wire 42 is in contact with the sensor 73, and outputs a signal for performing the feeding operation of the wire 42 performed by the spool when the wire 42 is separated from the sensor 73. The first tensioner 70 can form the first gas flow 70b in a direction where the wire 42 gets close to the stoppers 71a, 71b and the sensor 73, and thereby apply a tension on the wire 42 in the direction of the arrow 70a which is the supply side of the wire 42 while guiding the wire 42 by the stoppers 71a, 71b.

As shown in FIG. 3, the second tensioner 72 is configured to extend in a direction parallel to the axial direction of the bonding tool 40. Specifically, the second tensioner 72 has a first end 132 on the wire supply side, a second end 134 on the bonding tool 40 side, and an air suction part 136 arranged between the first end 132 and the second end 134. The air suction part 136 is connected to a gas supply source 140.

In addition, in the second tensioner 72, wire through holes 138a-138d are arranged from the first end 132 to the second end 134. The wire through holes 138a-138d communicate with each other so that their axes are aligned with each other, and the wire (not shown in FIG. 3) is made to pass through these holes. The wire through holes 138a and 138b extend from the first end 132 to the air suction part 136, and the wire through holes 138c and 138d are disposed downstream of the air suction part 136 and extend to the second end 134. As shown in FIG. 3, the wire through holes 138b and 138c have a narrow portion 139 of which the opening diameter is small, and suppresses gas from flowing toward the direction of the second end 134. On the other hand, as shown in FIG. 3, the wire through holes 138a and 138b are formed with a relatively larger opening diameter. Then, the compressed gas flowing from the gas supply source 140 into the air suction part 138 flows through the wire communication holes 138a and 138b toward the direction of the first end 132 (that is, the direction toward the wire supply side). In other words, the second tensioner 72 is configured to form second gas flows 72b-1 and 72b-2 directed upward so as to apply tension toward the wire supply side.

Returning to FIG. 1, the wire bonding apparatus 1 is further described. The control part 80 is connected so that transmission/reception of signals can be performed among the parts such as the XY drive mechanism 10, the Z drive mechanism 12, the ultrasonic horn 30 (the ultrasonic vibrator 60), the clamper 44, the load sensor 50, the first tensioner 70, the second tensioner 72, and the like. The operations of these parts are controlled by the control part 80, and thereby processing necessary for wire bonding can be performed.

In addition, an operation part 82 for inputting control information and a display part 84 for outputting control information are connected to the control part 80. Thereby, an operator can input necessary control information by the operation part 82 while recognizing a screen by the display part 84. Besides, the control part 80 is a computer apparatus including a CPU, a memory, and the like, and the memory stores in advance a bonding program for performing processing necessary for wire bonding, various data processed by each component (described later) in the control part 80, or the like. The control part 80 is configured to control operations necessary for performing a wire bonding method described later (for example, the control part 80 includes a program for causing a computer to execute each operation).

The control part 80 of the embodiment includes a first tensioner control part 90, a second tensioner control part 92, and a bonding control part 94.

The first tensioner controller 90 controls the first gas flow 70b of the first tensioner 70. Specifically, the first tensioner controller 90 activates the first gas flow 70b (hereinafter referred to as "ON control"), or deactivates the first gas flow 70b (hereinafter referred to as "OFF control"). When the first gas flow 70b is active, the first tensioner control part 90 further controls the magnitude of the flow velocity of the first gas flow 70b by adjusting the flow rate or the like of the first gas flow 70b. For example, the first tensioner control part 90 can switch between two stages, that is, a first ON control in which the flow velocity of the first gas flow 70b is high (hereinafter referred to as "HIGH control") and a second ON control in which the flow velocity of the first gas flow 70b is low (hereinafter referred to as "LOW control"). Besides, the switching of the magnitude of the flow velocity is not limited to two stages and may be three or more stages.

The second tensioner controller 92 controls the second gas flow 72b of the second tensioner 72. Specifically, the second tensioner control part 92 activates the second gas flow 72b (ON control), or deactivates the second gas flow 72b (OFF control). When the second gas flow 72b is active, the second tensioner control part 92 further controls the magnitude of the flow velocity of the second gas flow 72b by adjusting the flow rate or the like of the second gas flow 72b. For example, the second tensioner control part 92 can switch between two stages, that is, a first ON control in which the flow velocity of the second gas flow 72b is high (HIGH control) and a second ON control in which the flow velocity of the second gas flow 72b is low (LOW control). Besides, the switching of the magnitude of the flow velocity is not limited to two stages and may be three or more stages.

The second gas flow 72b controlled by the second tensioner controller 92 preferably has a flow velocity relatively higher than or substantially the same as that of the first gas flow 70b controlled by the first tensioner controller 90. Thereby, the wire tension can be effectively applied by controlling at least the second tensioner control part 92.

The bonding control part 94 controls processing necessary for the wire bonding operation, specifically, controls various parts such as the XY drive mechanism 10, the Z drive mechanism 12, the ultrasonic horn 30 (the ultrasonic vibrator 60), the clamper 44, the load sensor 50, and the like. The bonding control part 94, and the first tensioner control part 90 and the second tensioner control part 92 are configured so that one of them can be controlled corresponding to the operation of the other one.

Next, a manufacturing method for semiconductor apparatus of the embodiment is described with reference to FIGS. 4-6. This manufacturing method for semiconductor apparatus is performed by a wire bonding method executed by the wire bonding apparatus 1. Here, FIG. 4 is a flowchart. In addition, FIGS. 5(A)-5(H) are schematic diagrams showing the operation, and FIG. 6 is a timing chart of FIGS. 5(A)-5(H). Besides, times t1-t8 in FIGS. 5(A)-5(H) coincide with times t1-t8 in FIG. 6.

Hereinafter, description is given based on the flowchart of FIG. 4 with reference to FIGS. 5(A)-5(H) and FIG. 6.

(1) First Bonding Step (Time t1)

First, a first bonding step for the first bonding point is performed (S10).

Specifically, at time t1, the free air ball 43 (hereinafter referred to as "ball part 43") is formed at the front end of the wire 42 extending from the front end of the bonding tool 40, and the bonding tool 40 is lowered toward the electrode pad 112 of the semiconductor die 110 (see (A) of FIG. 5). At time t1, the clamper 44 is made open first, and then the clamper 44 is closed when the bonding tool 40 is lowered. In addition, the ultrasonic vibration and a spark are both turned off.

In order to improve the bonding processing speed, it is necessary to increase the lowering speed of the bonding tool 40, and increase the wire tension in proportion to the increased speed in that case. Based on this request, at time t1, the HIGH control is performed on both the first tensioner 70 and the second tensioner 72. Thereby, even if the lowing speed of the bonding tool 40 is increased, the first bonding can be appropriately performed in a state that the ball part 43 is reliably accommodated in the bonding tool 40.

Thereafter, as shown in FIG. 6, after lowering the bonding tool 40 and bringing the ball part 43 into contact with the electrode pad 112, the ON control is performed on the ultrasonic vibration while the clamper 44 is open, and the ball part 43 of the wire 42 is bonded to the electrode pad 112.

(2) Reverse Operation Step (Times t2 and t3)

Next, the wire 42 is reversed to the opposite side of the second bonding point so as to give a bent shape to the wire 42 (S11). The times t2 and t3 are examples of a reverse operation period.

Specifically, at time t2, the bonding tool 40 is raised while the clamper 44 is open, and the wire 42 is fed out of a ball part 43a bonded on the electrode pad 112 (see (B) of FIG. 5). At time t3, the bonding tool 40 is moved to the opposite side of the second electrode pad 122 to give a bent shape to the wire 42 (see (C) of FIG. 5). At times t2 and t3, the LOW control is performed on both the first tensioner 70 and the second tensioner 72. Thereby, it is possible to suppress the wire 42 bonded to the electrode pad 112 from being excessively stretched, and to give a suitable bent shape to the wire 42 with an appropriate wire tension.

(3) Wire Loop Formation Step (Times t4 and t5)

Next, the wire 42 is bent toward the second bonding point to form a wire loop (S12). The times t4 and t5 are examples of a wire loop formation period.

Specifically, at time t4, the bonding tool 40 is moved toward the electrode pad 122 of the substrate 120 so that the wire 42 draws a loop shape (see (D) of FIG. 5). Then, at time t5, a part of the wire 42 is brought into contact with the electrode pad 122 via the pressing part 41a of the bonding tool 40 (see (E) of FIG. 5). The clamper 44 is closed at time t4, and the clamper 44 is made open at time t5 when a part of the wire 42 is brought into contact with the electrode pad 122. Then, a wire loop 42a that electrically connects the electrode pad 112 serving as the first bonding point and the electrode pad 122 serving as the second bonding point can be formed.

At times t4 and t5, the LOW control is also performed on both the first tensioner 70 and the second tensioner 72. Thereby, similar to the reverse operation, it is possible to suppress the wire 42 bonded to the electrode pad 112 from being excessively stretched, and to give a suitable loop shape to the wire 42 with an appropriate wire tension.

(4) Second Bonding Step (after Time t5 and Before Time t6)

Subsequently, a second bonding step for the second bonding point is performed (S13).

Specifically, after time t5, a part of the wire 42 is pressed by the pressing part 41a of the bonding tool 40 while the clamper 44 is open, the ON control is performed on the ultrasonic vibration, and the part of the wire 42 is bonded to the electrode pad 122.

Besides, in the embodiment, after time t5, the HIGH control is performed on both the first tensioner 70 and the second tensioner 72.

(5) Wire Tail Formation Step (Times t6 and t7)

After the second bonding step is completed, a wire tail is formed for the next wire bonding (S14). The times t6 and t7 are examples of a wire tail formation period.

In the embodiment, at time t6, the bonding tool 40 is raised while the OFF control is performed on the ultrasonic vibration and the clamper 44 is open (see (F) of FIG. 5). A wire tail 42c having a predetermined wire length can be formed corresponding to the rising amount of the bonding tool 40. The wire tail 42c is connected to the wire loop 42a. Thereafter, at time t7, the bonding tool 40 is further raised while the clamper 44 is closed, and the ON control is performed on the ultrasonic vibration to thereby cut off the wire 42 (see (G) of FIG. 5). Then, a wire tail 42d extending from the front end of the bonding tool 40 can be formed. The wire tail 42d is cut off from a wire loop 42b. Besides, in the embodiment, the HIGH control is also performed on both the first tensioner 70 and the second tensioner 72 at times t6 and t7.

(6) Next wire bonding step (time t8 and subsequent time)

Besides, when the next wire bonding is performed, at time t8, the ON control is performed on the spark for the front end of the wire tail 42c, and the ball 43 is formed at the front end (see (H) of FIG. 5). After the ball part 43 is formed as described above, the bonding tool 40 is moved above the first bonding point for the next wire bonding. Then, the above-described steps (1)-(5) are performed for the next first bonding point and second bonding point. Besides, in the embodiment, the HIGH control is also performed on both the first tensioner 70 and the second tensioner 72 at time t8.

As described above, according to the embodiment, the control is implemented, in any predetermined period after the first bonding step, to make at least the second gas flow 72b of the second tensioner 72 smaller than in the first bonding step, and thus a suitable wire loop 42b can be formed without reducing the bonding processing speed. In addition, a separate clamper for making the wire tension suitable is not required. Accordingly, good wire bonding can be performed while satisfying the demand for maintainability and size reduction.

Second Embodiment

Next, a manufacturing method for semiconductor apparatus of a second embodiment of the present invention is described with reference to FIGS. 7(A)-7(G) and FIG. 8. FIGS. 7(A)-7(G) are schematic diagrams showing the operation, and FIG. 8 is a timing chart of FIGS. 7(A)-7(G). Besides, the times t4-t8 in FIGS. 7(A)-7(G) coincide with the times t4-t8 in FIG. 8. In the following embodiment, the same parts as those in the first embodiment are denoted by the same reference signs.

In the first embodiment, after the wire tail 42c connected to the wire loop 42a is formed, the wire tail 42d is formed by cutting off the wire 42 (FIGS. 5(F) and 5(D)). However, in the second embodiment, the wire tail 42c is formed at first after the wire 42 is cut off. In addition, in the second embodiment, the HIGH control is performed on both the first tensioner 70 and the second tensioner 72 in the period till time t5, and the OFF control is performed in the period from time t6a to time t7b. Hereinafter, points different from the first embodiment are described.

(1) First Bonding Step and Reverse Operation Step (Times t1-t3)

As shown in FIG. 8, at times t1-t3, the operations of the bonding tool 40, the clamper 44, the ultrasonic vibration, and the spark are the same as those in the first embodiment, and the contents already described can be applied. However, in the second embodiment, the HIGH control is performed on both the first tensioner 70 and the second tensioner 72 in the period from time t1 to time t3.

(2) Wire loop formation step (times t4 and t5) As shown in (A) of FIG. 7 and FIG. 8, at time t4, the operations of the bonding tool 40, the clamper 44, the ultrasonic vibration, and the spark are the same as those in the first embodiment, and the contents already described can be applied. However, in the second embodiment, the HIGH control is also performed on both the first tensioner 70 and the second tensioner 72 high at time t4.

Thereafter, as shown in (B) of FIG. 7, at time t5, a part of the wire 42 is brought into contact with the electrode pad 122 via the pressing part 41a of the bonding tool 40 while the clamper 44 is closed. The HIGH control is also maintained for both the first tensioner 70 and the second tensioner 72 at time 5.

(3) Second Bonding Step (after Time t5 and Before Time t6a)

Subsequently, after time t5, the part of the wire 42 is pressed by the pressing part 41a of the bonding tool 40 while the clamper 44 is closed, the ON control is performed on the ultrasonic vibration, and the part of the wire 42 is bonded to the electrode pad 122. In the embodiment, the OFF control is performed on both the first tensioner 70 and the second tensioner 72 at this timing.

(4) Wire tail formation step (times t6a-t7b)

At time t6a, the bonding tool 40 is raised while the OFF control is performed on the ultrasonic vibration and the clamper 44 is closed (see (C) of FIG. 7). Since the clamper 44 is closed as described above, the part of the wire 42 on the electrode pad 122 which is thinned by the second bonding is cut off due to the rising of the bonding tool 40.

Next, the clamper 44 is made open at time t6b (see (D) of FIG. 7), and the bonding tool 40 is further raised at time t7a (see (E) of FIG. 7). Then, the wire tail 42d extending from the front end of the bonding tool 40 can be formed. The wire tail 42d is cut off from the wire loop 42b. Thereafter, at time t7b, the clamper 44 is closed. Besides, in the embodiment, the OFF control is performed on both the first tensioner 70 and the second tensioner 72 in the period from time t6a to time t7b.

(5) Next wire bonding step (time t8 and subsequent time) Besides, as shown in (G) of FIG. 7 and FIG. 8, various operations in the case of performing the next wire bonding are the same as those in the first embodiment, and the contents already described can be applied.

As described above, in the second embodiment, in any predetermined period after the first bonding step, the OFF control is performed on at least the second gas flow 72b of the second tensioner 72, and thus the suitable wire group 42b can be formed without reducing the bonding processing speed. In addition, a separate clamper for making the wire tension suitable is not required. Accordingly, good wire bonding can be performed while satisfying the demand for maintainability and size reduction.

Third Embodiment

Next, a manufacturing method for semiconductor apparatus of a third embodiment of the present invention is described with reference to FIGS. 9(A)-9(F) and FIG. 10. FIGS. 9(A)-9(F) are schematic diagrams showing the operation, and FIG. 10 is a timing chart of FIGS. 9(A)-9(F). Besides, the times t4-t8 in FIGS. 9(A)-9(F) coincide with the times t4-t8 in FIG. 10. In the following embodiment, the same parts as those in the first embodiment are denoted by the same reference signs.

The third embodiment is the same as the first embodiment in terms of forming the wire tail 42d by cutting off the wire 42 after forming the wire tail 42c connected to the wire loop 42a. The third embodiment is different from the first embodiment in that the HIGH control is performed on both the first tensioner 70 and the second tensioner 72 in the period till time t4 and the OFF control is performed in the period from time t5 to time t6b. Hereinafter, points different from the first embodiment are described.

(1) First Bonding Step and Reverse Operation Step (Times t1-t3)

As shown in FIG. 10, at times t1-t3, the operations of the bonding tool 40, the clamper 44, the ultrasonic vibration, and the spark are the same as those in the first embodiment, and the contents already described can be applied. However, in the third embodiment, the HIGH control is performed on both the first tensioner 70 and the second tensioner 72 in the period from time t1 to time t3.

(2) Wire Loop Formation Step (Times t4 and t5)

As shown in FIGS. 9(A) and 10, at time t4, the operations of the bonding tool 40, the clamper 44, the ultrasonic vibration, and the spark are the same as those in the first embodiment, and the contents already described can be applied. However, in the third embodiment, the HIGH control is performed on both the first tensioner 70 and the second tensioner 72 at time t4.

Thereafter, as shown in (B) of FIG. 9, at time t5, a part of the wire 42 is brought into contact with the electrode pad 122 via the pressing part 41a of the bonding tool 40 while the clamper 44 is open. At time 5, the OFF control is performed on both the first tensioner 70 and the second tensioner 72 corresponding to the timing at which the clamper 44 transitions to the open state.

(3) Second Bonding Step (after Time t5 and Before Time t6a)

Subsequently, after time t5, the part of the wire 42 is pressed by the pressing part 41a of the bonding tool 40 while the clamper 44 is open, the ON control is performed on the ultrasonic vibration, and the part of the wire 42 is bonded to the electrode pad 122. In the third embodiment, the OFF control is also performed on both the first tensioner 70 and the second tensioner 72 after time t5.

(4) Wire tail formation step (times t6a-t7)

At time 6a, the bonding tool 40 is raised while the OFF control is performed on the ultrasonic vibration and the clamper 44 is open (see (C) of FIG. 9). The wire tail 42c having a predetermined wire length can be formed corresponding to the rising amount of the bonding tool 40. The wire tail 42c is connected to the wire loop 42a. Thereafter, the clamper 44 is closed at time t6b (see (D) of FIG. 9), and the bonding tool 40 is further raised at time t7 (see (E) of FIG. 9). Then, the wire tail 42d extending from the front end of the bonding tool 40 can be formed. The wire tail 42d is cut off from the wire loop 42b. Besides, in the third embodiment, at times t6a and t6b, the OFF control is performed on both the first tensioner 70 and the second tensioner 72, and the HIGH control is performed on both the first tensioner 70 and the second tensioner 72 at time t7.

(5) Next wire bonding step (time t8 and subsequent time) Besides, as shown in (F) of FIG. 9 and FIG. 10, various operations in the case of performing the next wire bonding are the same as those in the first embodiment, and the contents already described can be applied.

As described above, in the third embodiment, similar to the second embodiment, the OFF control is also performed on at least the second gas flow 72b of the second tensioner 72 in any predetermined period after the first bonding step, and thus a suitable wire loop 42b can be formed without reducing the bonding processing speed. In addition, a separate clamper for making the wire tension suitable is not required. Accordingly, good wire bonding can be performed while satisfying the demand for maintainability and size reduction.

In addition, in the third embodiment, the OFF control is performed on both the first tensioner 70 and the second tensioner 72 corresponding to the timing at which the wire loop formation step is completed, that is, the timing at which the clamper 44 is opened, and the ON control (for example, HIGH control) is performed on both the first tensioner 70 and the second tensioner 72 corresponding to the timing at which the wire tail formation step is completed, that is, the timing at which the clamper 44 is closed. The first tensioner 70 and the second tensioner 72 may be operated in this way corresponding to the timing of the opening/closing operation of the clamper 44.

The present invention is not limited to the above embodiments and can be applied with various modifications.

For example, the combination of the operations of the first tensioner 70 and the second tensioner 72 is not limited to the aspects described in the first to third embodiments, and any two or more of the first to third embodiments can be applied in combination. For example, in the period from time t2 to time t5, the LOW control may be performed for the operations of the first tensioner 70 and the second tensioner 72 as described in the first embodiment (see FIG. 6), and in the period from time t5 to time t7b, the OFF control may be performed for the operations of the first tensioner 70 and the second tensioner 72 as described in the second embodiment (see FIG. 8).

Besides, it is not necessary to control both the first tensioner 70 and the second tensioner 72 together, and the contents described in the above embodiments may be applied to, for example, only the second tensioner 72.

In addition, the configurations of the first tensioner 70 and the second tensioner 72 are not limited to those described in the above embodiments, and are not limited as long as the configurations are capable of applying a tension to the wire 42. In particular, the second tensioner 72 only needs to be capable of applying wire tension between the first tensioner 70 and the pressing part 41a of the bonding tool 40, and may provide a function of the tensioner to a part of the configuration of the bonding tool 40.

The aspects described through the above embodiments of the present invention can be used with appropriate combination, alterations, or improvements corresponding to the application, and the present invention is not limited to the description of the above embodiments. It is apparent from the description of the claims that the embodiments to which the combinations, alterations, or improvements are applied can also be included in the technical scope of the present invention.

What is claimed is:

1. A wire bonding apparatus, which manufactures a semiconductor apparatus having a wire loop in which a first bonding point and a second bonding point are connected by a wire, comprising:
    a bonding arm movable on a plane parallel to a bonding surface and in a direction perpendicular to the bonding surface;
    an ultrasonic horn attached to a front end of the bonding arm;
    a bonding tool attached to one end of the ultrasonic horn, and having a pressing part for pressing a wire made to pass through the inside of the bonding tool to the first bonding point and the second bonding point to be bonded;
    a first tensioner which forms, nearer the wire supply side than the bonding tool, a first gas flow for applying a tension toward the wire supply side on the wire;
    a second tensioner which forms, between the first tensioner and the pressing part of the bonding tool, a second gas flow for applying a tension toward the wire supply side on the wire; and
    a control part which controls the first tensioner and the second tensioner;
        wherein the control part implements control, in a first bonding step comprising lowering the wire toward the first bonding point and bonding the wire to the first bonding point, to turn on both the first gas flow of the first tensioner and the second gas flow of the second tensioner, and
        the control part implements control, in a predetermined period after a first bonding step, to turn off at least the second gas flow of the second tensioner among the first and second tensioners or to make at least the second gas flow smaller than in the first bonding step.

2. The wire bonding apparatus according to claim 1, wherein the control part implements control, in the predetermined period, to turn off both the first gas flow of the first tensioner and the second gas flow of the second tensioner.

3. The wire bonding apparatus according to claim 1, wherein the control part implements control, in the predetermined period, to make both the first gas flow of the first tensioner and the second gas flow of the second tensioner smaller than in the first bonding step.

4. The wire bonding apparatus according to claim 1, wherein the predetermined period comprises one or more periods among a reverse operation period for reversing the wire to the opposite side of the second bonding point after the first bonding step, a wire loop formation period for bending the wire toward the second bonding point to form a wire loop, a second bonding period for bonding the wire to the second bonding point, and a wire tail formation period for forming a wire tail cut off from the wire bonded to the second bonding point.

5. The wire bonding apparatus according to claim 4, wherein the wire tail formation period is a period for forming the wire tail after the wire is cut.

6. The wire bonding apparatus according to claim 4, wherein the wire tail formation period is a period for cutting the wire after the wire tail is formed.

7. The wire bonding apparatus according to claim 1, wherein the second tensioner is disposed nearer the wire supply side than the bonding tool.

8. A manufacturing method for semiconductor apparatus, which is a method for manufacturing a semiconductor apparatus having a wire loop in which a first bonding point and a second bonding point are connected by a wire, comprising:

a step for preparing: a bonding arm movable on a plane parallel to a bonding surface and in a direction perpendicular to the bonding surface, an ultrasonic horn attached to a front end of the bonding arm, a bonding tool attached to one end of the ultrasonic horn, and having a pressing part for pressing a wire made to pass through the inside of the bonding tool to the first bonding point and the second bonding point to be bonded, a first tensioner which forms, nearer the wire supply side than the bonding tool, a first gas flow for applying a tension toward the wire supply side on the wire, a second tensioner which forms, between the first tensioner and the pressing part of the bonding tool, a second gas flow for applying a tension toward the wire supply side on the wire, and a control part which controls the first tensioner and the second tensioner;

a first bonding step comprising lowing the wire toward the first bonding point and bonding the wire to the first bonding point;

a reverse operation step for reversing the wire to the opposite side of the second bonding point after the first bonding step;

a wire loop formation step for bending the wire toward the second bonding point to form in a wire loop;

a second bonding step for bonding the wire to the second bonding point; and a wire tail formation step for forming a wire tail cut off from the wire bonded to the second bonding point;

wherein the control part implements control, in the first bonding step, to turn on both the first gas flow of the first tensioner and the second gas flow of the second tensioner, and the control part implements control, in a predetermined step after the first bonding step, to turn off at least the second gas flow of the second tensioner among the first and second tensioners or to make at least the second gas flow smaller than in the first bonding step.

9. The manufacturing method for semiconductor apparatus according to claim 8, wherein the control part implements control, in the predetermined step, to turn off both the first gas flow of the first tensioner and the second gas flow of the second tensioner.

10. The manufacturing method for semiconductor apparatus according to claim 8, wherein the control part implements control, in the predetermined step, to make both the first gas flow of the first tensioner and the second gas flow of the second tensioner smaller than in the first bonding step.

* * * * *